United States Patent [19]

Schröder

[11] 4,306,202
[45] Dec. 15, 1981

[54] COMPANDER

[75] Inventor: Ernst Schröder, Hanover, Fed. Rep. of Germany

[73] Assignee: Licentia Patent-Verwaltungs-G.m.b.H., Frankfurt am Main, Fed. Rep. of Germany

[21] Appl. No.: 131,846

[22] Filed: Mar. 19, 1980

[30] Foreign Application Priority Data

Mar. 29, 1979 [DE] Fed. Rep. of Germany ....... 2912346

[51] Int. Cl.³ ............................................ H04B 1/64
[52] U.S. Cl. ...................................... 333/14; 330/107; 330/144; 330/284
[58] Field of Search .................... 333/14; 330/86, 282, 330/144, 145, 107, 284; 455/72

[56] References Cited

U.S. PATENT DOCUMENTS 3,735,290   5/1973   Yamazaki ............................ 333/14
3,969,680   7/1976   Wermuth ......................... 333/14 X
4,054,849  10/1977   Yamada ................................ 333/14

Primary Examiner—Paul L. Gensler
Attorney, Agent, or Firm—Spencer & Kaye

[57] ABSTRACT

Circuit for automatic dynamic compression an/or expansion. The circuit has adjusting member (10) for varying the propagation constant in a useful signal path and a further similar adjusting member (30) for varying the propagation constant in a branch path which serves for deriving a control voltage which is applied to the control inputs (11,31) of the adjusting members (10,30) in the useful signal path and in the branch path. Further the circuit has a lowpass circuit (20 . . . 26) which is connected to the adjusting member (10) located in the useful signal path. The circuit can be changed over to a different compander characteristic when the adjusting member (10) located in the useful signal path is connected up as a controllable highpass (10,15). The limiting frequency is of the order of magnitude of the limiting frequency of the lowpass circuit (20 . . . 26). The highpass can be formed by a capacitor (15) in series with the adjusting member (10) in the useful signal path and the highpass function for low frequencies can be limited by a resistor (12) in parallel with the adjusting member (10) and the capacitor (15). The limiting frequency of the lowpass circuit (20 . . . 26) is reduced by an additional capacitor (27) in parallel with the capacitor (26) already provided. In both operation modes, the same voltage generator (30 . . . 36) is used for controlling the adjusting member (10) in the useful signal path.

5 Claims, 1 Drawing Figure

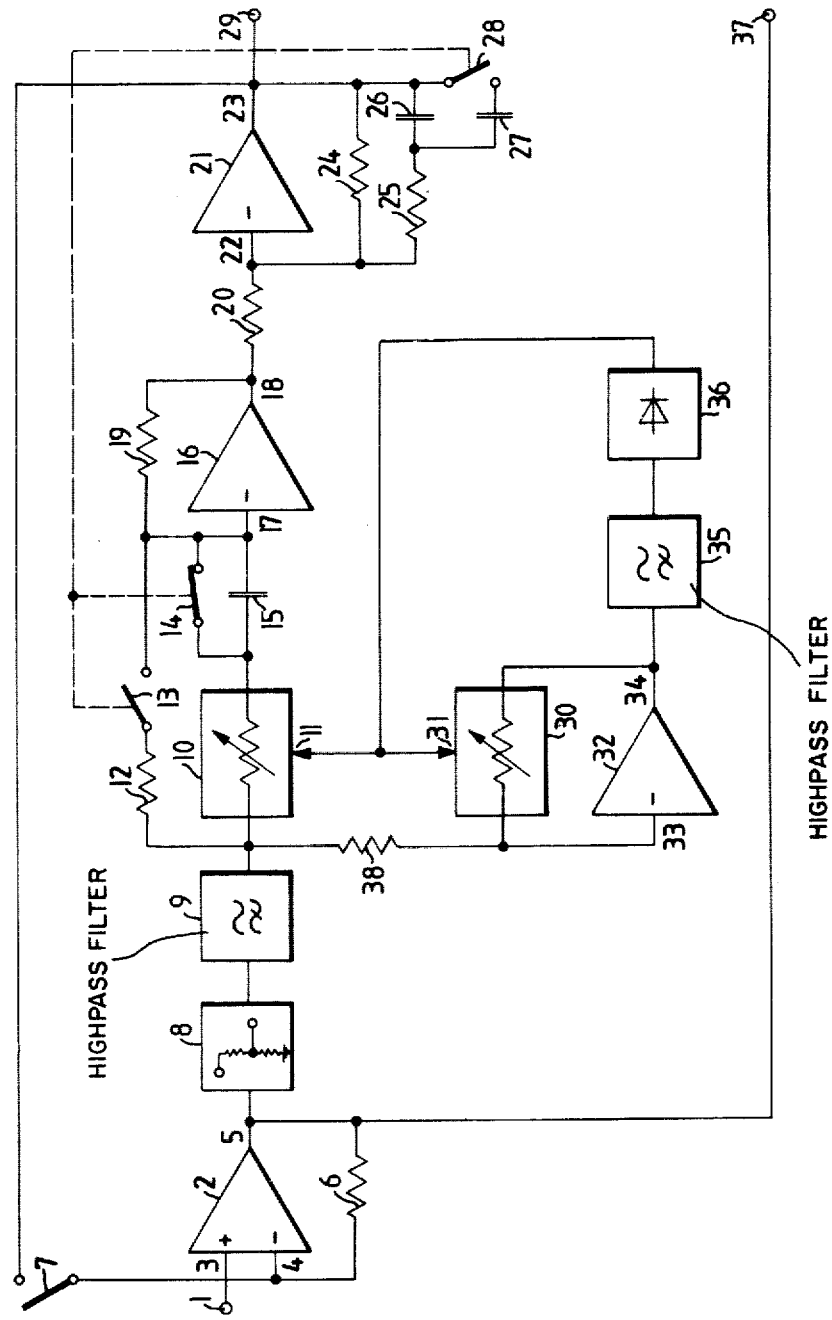

COMPANDER

The invention relates to a circuit for automatic dynamic compression and/or expansion of a useful signal.

The block circuit diagram of such a compander is illustrated in the article "Der Telefunken-Kompander" in the journal "Rundfunktechnische Mitteilungen", Year 22 (1978), Volume 2, in FIG. [Bild] 13 and is described in paragraph 4.2 thereof. Since this compander effects a wideband treatment of the signals, a compatible reproduction of recordings which e.g. have been effected with a compressor according to the sliding band procedure is not possible. For the recording and reproduction of LF performances by this procedure a complete change-over of the compander could indeed be effected, so that the parameters introduced for a known sliding band procedure are accurately retained; this change-over would however be too expensive.

The invention is therefore based on the problem of providing a modification of the known circuit so that it follows the sliding band parameters so accurately that the remaining deviations cannot be noticed physiologically.

This problem is solved, in a circuit for automatic dynamic compression and/or expansion having an adjusting member for varying the transfer characteristic in a useful signal path and a further similar adjusting member for varying the transfer characteristic in a branch path which serves for deriving a control voltage which is applied to the control inputs of the adjusting members in the useful signal path and in the branch path, and having a lowpass filter circuit which is connected to the adjusting member located in the useful signal path, by constructing the adjusting member located in the useful signal path as a controllable highpass filter having a limiting frequency of the order of magnitude of the limiting frequency of the lowpass filter circuit.

With the invention, amplifiers, adjusting members and frequency-dependent networks already present are utilised in an advantageous manner. The principle of operation of the circuit according to the invention depends essentially on the fact that the influencing of the frequency of a lowpass filter circuit with fixed limiting frequency is partially compensated by a controllable highpass filter of variable limiting frequency in accordance with useful signals. As compared with an exact treatment of the LF signals by a sliding band circuit, the circuit according to the invention indeed effects an amplitude shift of individual parts of the spectrum; it has been found, however, that these transmission errors are not noticed in practice. Moreover, with a critical treatment of these transmission errors account must be taken of the fact that an accurately dimensioned and constructed sliding band circuit effects an amplitude shift of parts of the spectrum even if a magnetic tape storage device gives rise to a peak error between the compressor output signal and the expander input signal, owing e.g. to different types of tape.

The invention will now be explained with reference to a practical example which is illustrated in the drawing. Firstly the operating mode will be considered in which the coupled switches 13, 14 and 28 are in the position shown. In this case the circuit operates as a wideband compander. For treating the signals to effect a compression, the switch 7 is closed. The path for the useful signals then leads from an input terminal 1 via the non-inverting input 3 of an amplifier 2 to the output 5 of the amplifier and thence to an output terminal 37 at which the compressed signals can be taken off. The amplifier 2 has its output 5 negatively fed back to its inverting input 4 via the series circuit comprising an attenuating member 8, a highpass filter 9, a controllable resistor 10, an inverter 16 having an input 17, an output 18 and a negative feed back resistor 19, and a lowpass filter circuit having an inverting amplifier 21. The lowpass filter circuit includes the inverting amplifier 21, with input 22 and output 23, resistors 20, 24 and 25 and a capacitor 26. For obtaining the control voltage for the adjusting member 10 a branch path having a similar adjusting member 30 is provided. The compressed signals are fed to the branch path from the output of the highpass filter 9 and pass via an inverting amplifier arrangement, which has a resistor 38, an amplifier 32 with input 33 and output 34, and the adjusting member 30, and via a highpass filter 35 to a rectifier 36. The control voltage obtainable at the output of this rectifier is applied to control inputs 11 and 31 of the adjusting members 10 and 30. Since during compression the adjusting member 10 associated with the useful signal path is arranged in the negative feedback path of the amplifier 2, and the adjusting member 10 and the adjusting member 30 are both controlled in the same manner, the dynamic of a useful signal applied to the input terminal 1 is regulated beyond the amplifier 2 to half the dynamic value, and at the input of the rectifier 36 is regulated to the dynamic value 0 dB.

If the switch 7 is opened to change over to the "expansion" operating mode, the circuit elements located in the negative feedback path for the "compression" operating mode are now located in the signal path. The expanded signals can be taken off at an output terminal 29. The amplifier 2 has the constant amplification "1" due to the provision of a negative feedback resistor 6 between its output 5 and its inverting input 4. In the "expansion" operating mode also the signals fed to the branch path are regulated to the stationary value 0 dB. Since however, in contrast to the controllable resistor 30 in the branch path, the controllable resistor 10 in the signal path is in series in relation to the useful signals, with the same control of the controllable resistors 30, 10 an expansion occurs in the signal path.

The attenuating member 8 serves for matching the level of the output signals of the amplifier 2 to the control range of the controllable resistors 10 and 30. On the output side this lowering of level is raised again by the amplification of the amplifiers 16 and 21. The highpass filter 9 as well as the highpass filter 35 have the task of effecting a reduction of level for high frequencies, in order to avoid band overcontrol effects in magnetic tape recording. The amplifier 21 has a lowpass filter character owing to its external connections. In the "compression" operating mode this lowpass filter is located in the negative feedback path of the amplifier 2, so that the circuit as a whole operates as a highpass filter. Owing to the re-arrangement of the lowpass circuit for compression and for expansion, pre-emphasis is effected during "compression" and de-emphasis during "expansion". This step is comparable to the band limit shift in accordance with the sliding band procedure. With the circuit described, however, the limiting frequencies are fixed.

For changing over the arrangement to a different compander characteristic the coupled switches 13, 14 and 28 are brought into the position not shown; i.e., switches 13 and 28 are closed and switch 14 is opened.

There results the most important feature that by the inclusion of a capacitor 15 in series with the adjusting member 10 a controllable highpass filter is provided. The highpass function is limited in the direction of low frequencies by a resistor 12 in parallel with the adjusting resistor 10 and the capacitor 15. The connection of a capacitor 27 in parallel with the capacitor 26 already present represents an additional feature that assists optimal matching to the sliding band parameter. The limiting frequencies of the lowpass filter circuit 20 . . . 28 and of the highpass filter circuit 10 . . . 15 are of the same order of magnitude. The actions of the two circuits are thus oppositely directed. By varying the adjusting member 10 there is effected a shift of the limiting frequency of the highpass filter circuit as well as a change of the amplification in the upper frequency range. In contrast to the sliding band procedure, however, here only one limiting frequency is altered. The amplitude shifts therefore take place in particular spectral regions of the signals. However, these frequency errors in direct sequential comparison with an accurately operating sliding band circuit are not noticeable in practice. Also, a measurement check shows that tolerances are within a ±3 dB field.

It is worth noting that for the control of the adjusting member 10 the same voltage generator is used as in the "wideband" mode of operation. This is based on appreciation of the fact that the branch path with its adjusting member and the control voltage generator operates as a negative feedback rectifier and hence as a circuit which, independently of the type of signal, represents a reproducible quantity for the alternating voltage.

I claim:

1. In a circuit for automatic dynamic compression and/or expansion having a first adjusting member connected in a useful signal path for varying the transfer characteristic in the useful signal path and a second similar adjusting member for varying the transfer characteristic in a branch path which serves for deriving a control voltage which is applied to the control inputs of the adjusting members in the useful signal path and in the branch path, and having a lowpass filter circuit which is connected to the first adjusting member, the improvement comprising circuit means connectable to said first adjusting member for forming therewith a controllable highpass filter having a limiting frequency of the order of magnitude of the limiting frequency of said lowpass filter circuit, and wherein said highpass filter and lowpass filter circuit are connected together in series in the useful signal path.

2. Circuit according to claim 1 further comprising switching means connected for switching between a state in which it selectively connects said circuit means to said first adjusting member to form said highpass filter to give said circuit the characteristic of a sliding-band compander, and a state in which it effectively disconnects said circuit means to give said circuit the characteristic of a wide-band compander.

3. Circuit according to claim 1 or 2 wherein said circuit means is formed by a capacitor connected in series with said first adjusting member and by a resistor connected in parallel with said first adjusting member and said capacitor for limiting the highpass operation of said highpass filter for low frequencies.

4. Circuit according to claim 2 wherein said lowpass filter circuit comprises a first capacitor imparting a selected limiting frequency to said lowpass filter circuit, and a second capacitor selectively connectable in parallel with said first capacitor for reducing the limiting frequency of said lowpass filter circuit.

5. Circuit according to claim 2 further comprising a single voltage generator connected for supplying the control voltage to said first adjusting member when said switching means is in either of its switching states.

* * * * *